United States Patent
Choi et al.

(10) Patent No.: US 6,500,716 B2
(45) Date of Patent: Dec. 31, 2002

(54) METHOD FOR FABRICATING HIGH VOLTAGE TRANSISTOR

(75) Inventors: Jae Seung Choi; Sang Bae Yi, both of Seoul; Sung Youn Kim, Chungcheongbuk-do; Jung Hoon Seo, Pusan-si, all of (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 46 days.

(21) Appl. No.: 09/767,264

(22) Filed: Jan. 23, 2001

(65) Prior Publication Data
US 2001/0023106 A1 Sep. 20, 2001

(30) Foreign Application Priority Data

Mar. 15, 2000 (KR) ........................................ 2000-13116

(51) Int. Cl.⁷ ............................................. H01L 21/336
(52) U.S. Cl. ........................................ 438/289; 438/291
(58) Field of Search ................................ 438/289, 291, 438/527

(56) References Cited

U.S. PATENT DOCUMENTS

| | | | |
|---|---|---|---|
| 4,573,066 A | 2/1986 | Whight | 257/495 |
| 4,602,266 A | 7/1986 | Coe | 257/495 |
| 4,774,560 A | 9/1988 | Coe | 257/495 |
| 5,075,739 A | 12/1991 | Davies | 257/170 |
| 5,648,288 A * | 7/1997 | Williams et al. | 438/202 |
| 6,165,858 A * | 12/2000 | Gardner et al. | 438/305 |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 326–327.*

* cited by examiner

Primary Examiner—Trung Dang
Assistant Examiner—William M. Brewster
(74) Attorney, Agent, or Firm—Morgan, Lewis & Bockius LLP

(57) ABSTRACT

A method for fabricating a high voltage transistor includes the steps of: forming a plurality of drift regions on a semiconductor substrate of a first conductive type; implanting drift ions of a second conductive type into surfaces of the drift regions of the semiconductor substrate at a first depth; implanting drift ions of the second conductive type into the surfaces of the drift regions of the semiconductor substrate at a second depth deeper than the first depth; implanting first conductive channel stop ions into the semiconductor substrate thereby forming a space between the semiconductor substrate and the drift regions; forming a device isolation film on a surface of the semiconductor substrate into which the channel stop ions are implanted; forming a gate electrode by inserting a gate insulating film on the semiconductor substrate between the drift regions; and forming a source/drain impurity diffusion region of a second conductive type in the surface of the semiconductor substrate at both sides of the gate electrode.

15 Claims, 8 Drawing Sheets

METHOD FOR FABRICATING HIGH VOLTAGE TRANSISTOR

BACKGROUND OF THE INVENTION

This application claims the benefit of Application No. P2000-13116, filed in Korea on Mar. 15, 2000, which is hereby incorporated by reference.

FIELD OF THE INVENTION

The present invention relates to a method for fabricating a semiconductor device, and more particularly, to a method for fabricating a high voltage transistor which increases a breakdown voltage.

BACKGROUND OF THE RELATED ART

Generally, a high voltage transistor is formed on a semiconductor substrate. A source/drain region and a channel are formed on the semiconductor substrate. An insulating layer and a conductive gate are sequentially formed on the channel. A drift region is formed to entirely wrap the source/drain region.

The drift region has a deep junction depth so that an electric field is diffused, thereby increasing a junction breakdown voltage due to concentration of the electric field.

A method for fabricating a related art high voltage transistor will be described with reference to the appended drawings.

FIGS. 1a to 1f are sectional views showing a method for fabricating a related art high voltage transistor.

As shown in FIG. 1a, a first photoresist 12 is deposed on a p-type semiconductor substrate 11. The first photoresist 12 is patterned by exposing and developing processes, so that a drift region is defined.

N-type impurity ions are implanted into the drift region of the semiconductor substrate 11 using the patterned first photoresist 12 as a mask, wherein the N-type impurity ions are implanted with an energy of 10 keV or less and at a dose from 1E13 to 5E14. The n-type impurity ions are diffused by a heat diffusion process of 900° C. to 100° C. so that a drift region 13 is deeply formed on a first surface of the semiconductor substrate 11.

As shown in FIG. 1b, the first photoresist 12 is eliminated, and an oxide film 14 and a nitride film 15 are sequentially formed on an entire second surface of the semiconductor substrate 11. The oxide film 14 and the nitride film 15 corresponding to a field region are selectively eliminated by photolithography and etching process.

Channel stop ions are implanted into the exposed semiconductor substrate 11 using the oxide film 14 and the nitride film 15 as masks.

As shown in FIG. 1c, a local oxidation of silicon (LOCOS) process is performed on the semiconductor substrate 11, into which the channel ions are implanted, so that the field oxide film 16 is formed on a third surface of the semiconductor substrate 11, and the oxide film 14 and the nitride film 15 are eliminated.

As shown in FIG. 1d, ions for controlling a threshold voltage are implanted into the semiconductor substrate 11. A gate oxide film 17 is formed on a whole fourth surface of the semiconductor substrate 11 and a polysilicon layer 18 is formed on the gate oxide film 17.

A second photoresist 19 is deposited on the polysilicon layer 18 and is patterned by the exposing and developing processes, so that a gate region is defined.

As shown in FIG. 1e, the polysilicon layer 18 and the gate oxide film 17 are selectively eliminated using the patterned second photoresist 19 as a mask, so that a gate electrode 18a is formed.

As shown in FIG. 1f, the second photoresist 19 is eliminated, and an insulating layer is formed on an entire fifth surface of the semiconductor substrate 11 including the gate electrode 18a. Sidewall spacers 20 are formed on both sides of the gate electrode 18a by an etching-back process. N-type high-concentration impurity ions for a source/drain are implanted into an entire sixth surface of the semiconductor substrate 11 so that a source/drain impurity diffusion region 21 is formed into the sixth surface of the semiconductor substrate 11 at both sides of the gate electrode 18a.

Accordingly, in the method for fabricating the related art high voltage transistor, drift ions implantation is performed to achieve high junction breakdown voltages and then, the drift region 13 is formed by using the heat diffusion process of 900° C. to 1100° C.

To deeply form the drift region 13, a dopant is diffused by the heat diffusion process of 900° C. to 1100° C. In this configuration, the dopant diffuses from an edge of a diffusion window to a side thereof. Thus, a cylindrical junction is formed in the edge while a spherical junction is formed in a sharp corner of the diffusion window. This reduces a curvature of a depletion layer, thereby reducing the junction breakdown voltage. This may be known by distribution of the electric field between deep junction and shallow junction at one doping level.

In this case, the deep junction and the shallow junction have an equal depletion width to an applied reverse bias. However, in case of the shallow junction, high local electric field occurs at which lines of the electric field are further concentrated. The concentration of the lines of the electric field reduces the breakdown voltage.

Therefore, to diffuse the electric field by increasing the related art depletion width, a floating field ring or an equipotential field plate may be formed around the diffusion window.

However, there are several problems with the related art method for fabricating a high voltage transistor.

When the drift region is deeply formed by the heat diffusion process of high temperature, lateral diffusion is increased correspondingly, thereby deteriorating a short channel effect.

Furthermore, when the drift region is deeply formed by the heat diffusion process of high temperature, the high temperature process affects a junction of a low logic portion or the doping of the channel and therefore, should be initially performed.

Finally, the floating field ring or the equipotential field plate may be formed around the diffusion window so that an electric field is diffused by increasing the depletion width. However, this has disadvantages in view of a chip size.

SUMMARY OF THE INVENTION

Accordingly, the present invention is directed to a method for fabricating a high voltage transistor that substantially obviates one or more of the problems due to limitations and disadvantages of the related art.

An object of the present invention is to provide a method for fabricating a high voltage transistor in which a breakdown voltage and a packing density are improved.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for fabricating a high voltage transistor according to the present invention includes the steps of forming a plurality of drift regions on a semiconductor substrate of a first conductive type, implanting drift ions of a second conductive type into surfaces of the drift regions of the semiconductor substrate at a first depth, implanting drift ions of the second conductive type into the surfaces of the drift regions of the semiconductor substrate at a second depth deeper than the first depth, implanting first conductive channel stop ions into the semiconductor substrate thereby forming a space between the semiconductor substrate and the drift regions, forming a device isolation film on a surface of the semiconductor substrate into which the channel stop ions are implanted, forming a gate electrode by inserting a gate insulating film on the semiconductor substrate between the drift regions, and forming a source/drain impurity diffusion region of a second conductive type in the surface of the semiconductor substrate at both sides of the gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A method for fabricating a high voltage transistor according to the present invention will be described with reference to the FIGS. 2a to 2g.

Figure 1A:
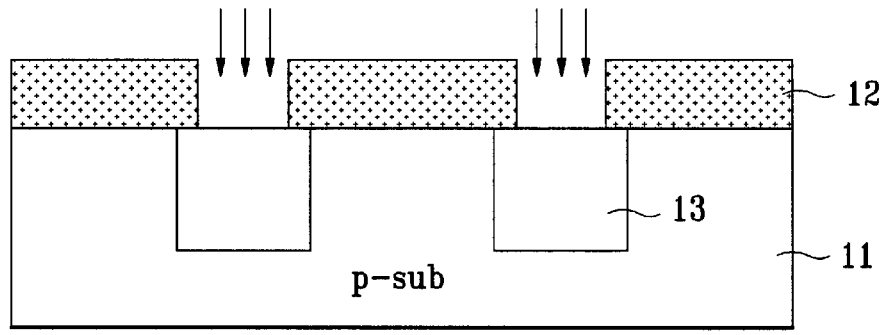
FIGS. 1a to 1f are sectional views showing a related art method for fabricating a high voltage transistor.
Figure 1B:
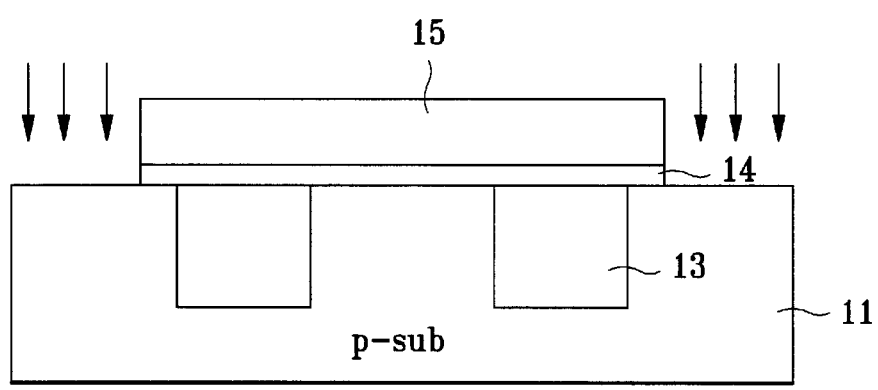
Figure 1C:
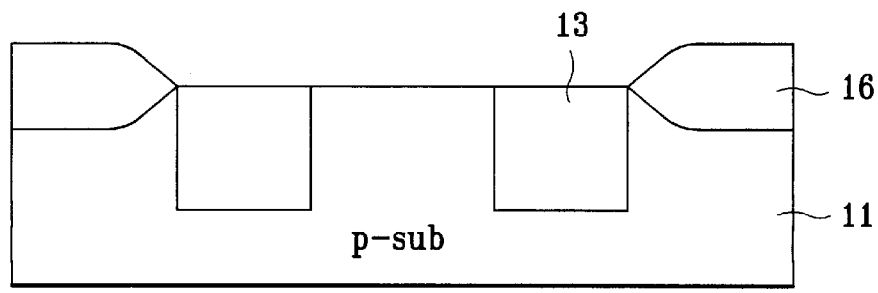
Figure 1D:
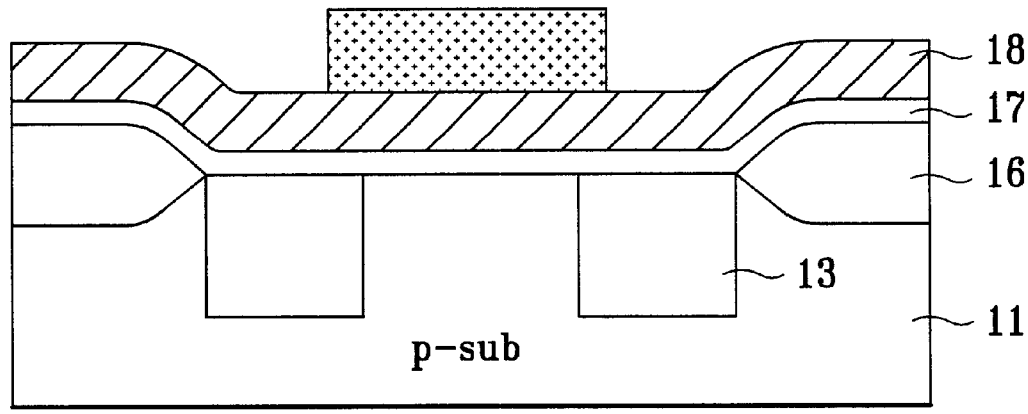
Figure 1E:
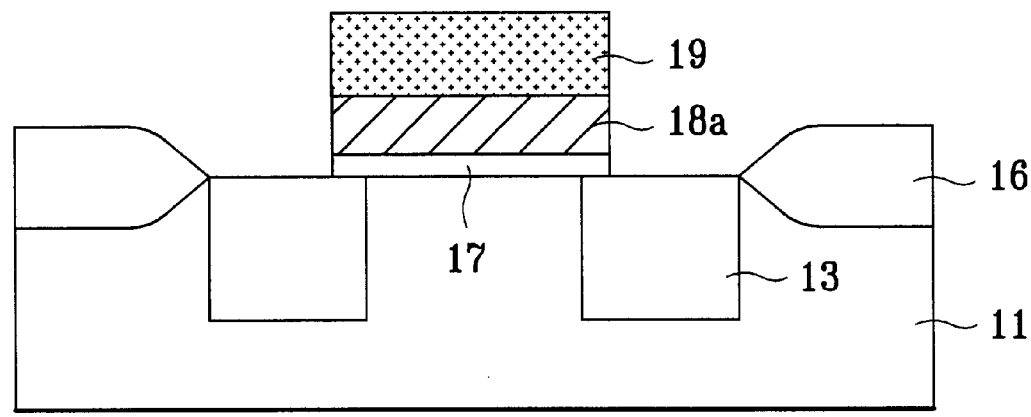
Figure 1F:
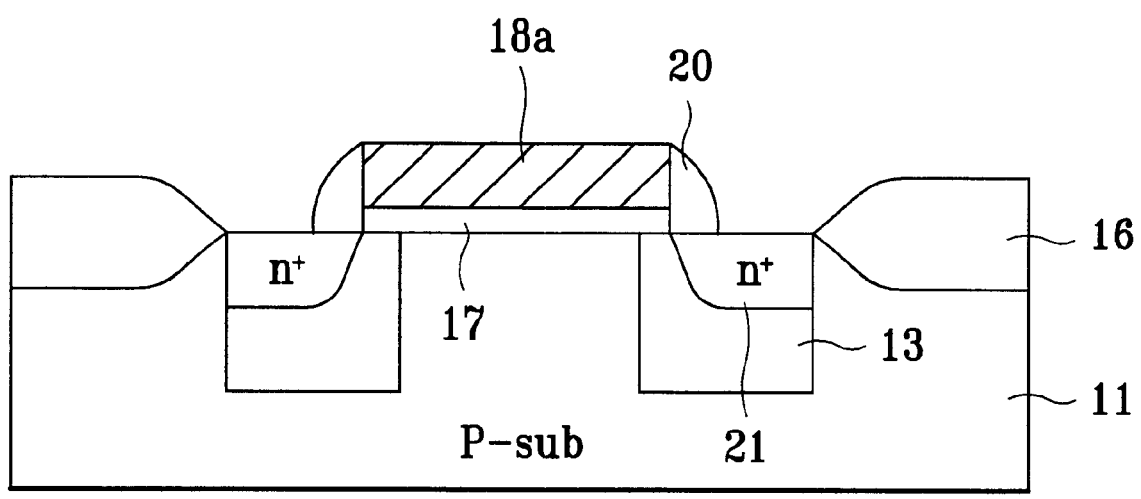
Figure 2A:
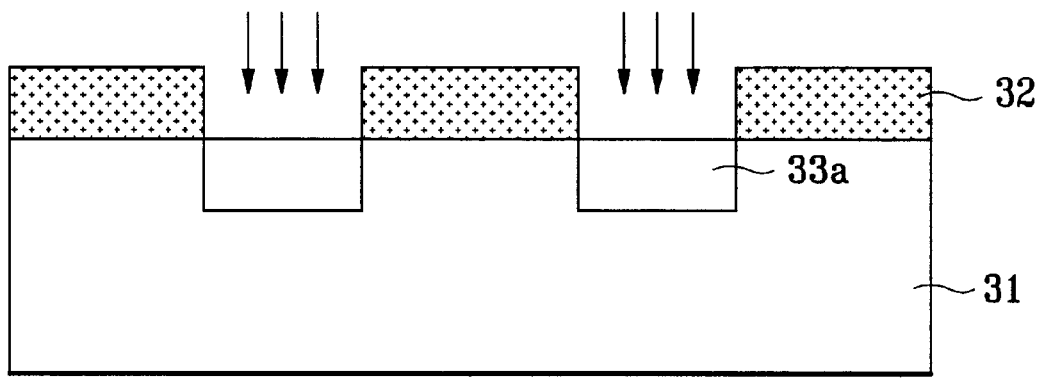
FIGS. 2a to 2g are sectional views showing a method for fabricating a high voltage transistor according to the present invention.

As shown in FIG. 2a, a first photoresist 32 is doped on a p-type semiconductor substrate 31 and then, is patterned by exposing and developing processes, so that a drift region is defined.

Subsequently, n-type first impurity ions are implanted into the drift region of the semiconductor substrate 31 using the patterned first photoresist 32 as a mask, wherein the first n-type impurity ions are implanted at a dose of 1E13 to 5E14. Accordingly, a first drift region 33a is formed in a first surface of the semiconductor substrate 31, at a projection range of 0.01 $\mu$m to 0.31 $\mu$m.

At this time, p-type impurity ions may be implanted into the drift region of the n-type semiconductor substrate.

Figure 2B:
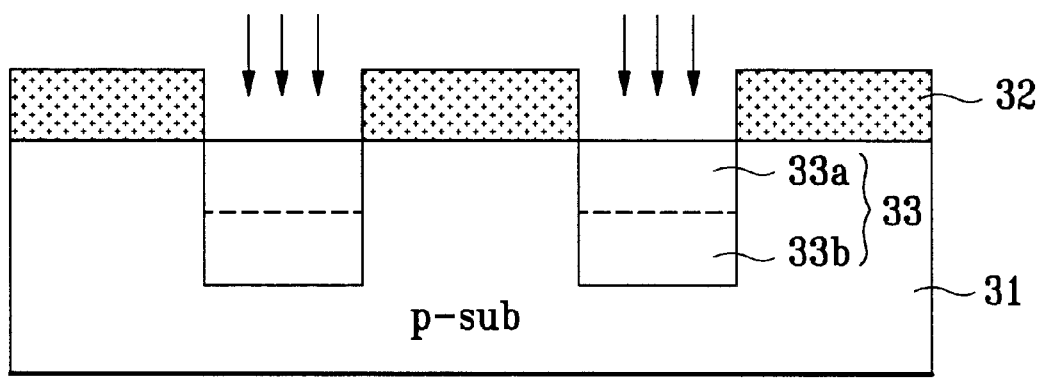

As shown in FIG. 2b, n-type second impurity ions are implanted into a region in which the n-type impurity. ions are implanted, using the first photoresist 32 as a mask, wherein the n-type second impurity ions are implanted at a dose of 1E13 to 5E14. Accordingly, a second drift. region 33b is formed in the first surface of the semiconductor substrate 31 at a projection range of 0.5 $\mu$m to 1.51 $\mu$m.

The first and second drift regions 33a and 33b will be now referred to as a drift region 33.

As described above, the present invention forms the drift region 33 using a first dose and a second dose not equal to the first dose. Accordingly, although the drift region 33 has the same depth with that of a related art drift region, literal diffusion may be avoided when forming the drift region 33, thereby improving short channel effect.

Furthermore, in accordance with another embodiment of the present invention, the n-type first and second impurity ions are implanted, and then a heat diffusion process of 900° C. to 1100° C. is performed. In this case, since the drift region 33 is deeper than a related art drift region can be formed, breakdown voltage can be increased.

Figure 2C:
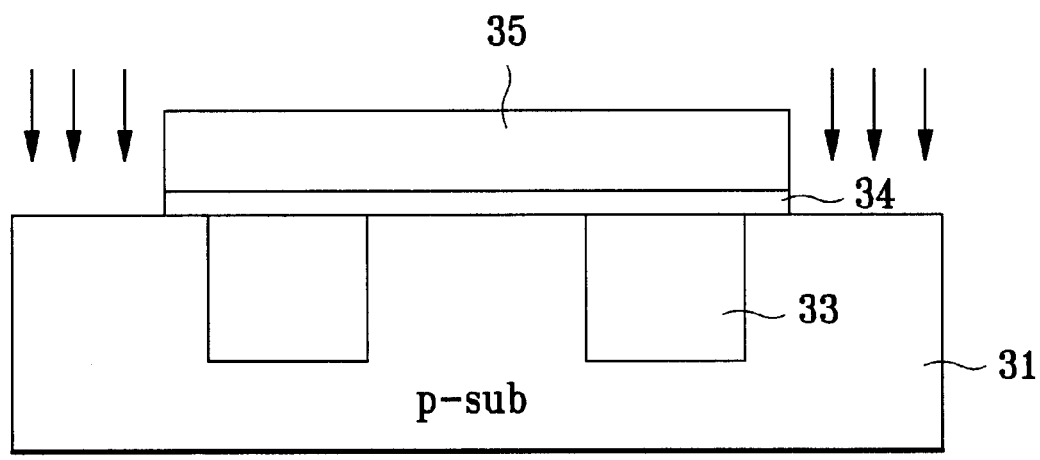

As shown in FIG. 2c, the first photoresist 32 is eliminated, an oxide film 34 and a nitride film 35 are sequentially formed on an entire second surface of the semiconductor substrate 31. The oxide film 34 and the nitride film 35 are selectively eliminated by photolithography and etching process.

Channel stop ions are implanted into the semiconductor substrate 31, of which a third surface is exposed, using the eliminated oxide film 34 and the nitride 35 as masks.

Herein, the channel stop ions may be spaced apart from the drift region 33 at an interval of 0.51 $\mu$m to 2.0 $\mu$m.

Figure 2D:
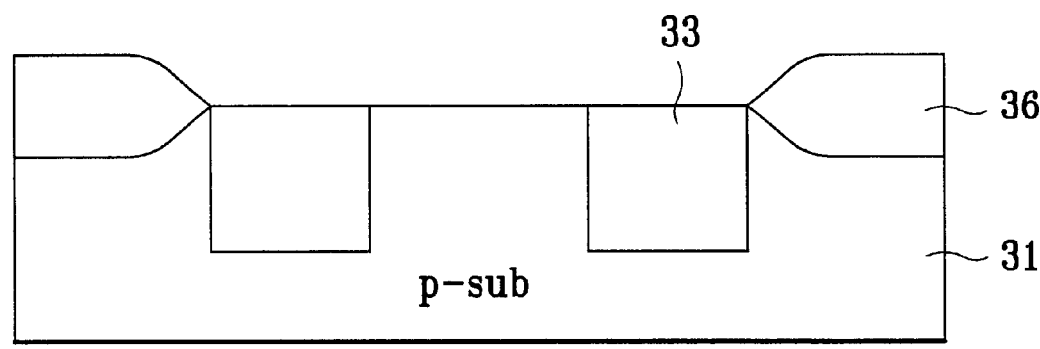

As shown in FIG. 2d, a LOCOS process is performed on the semiconductor substrate 31 into which the channel stop ions are implanted. Thus, a field oxide film 36 is formed on a fourth surface of the semiconductor substrate 31, and the oxide film 34 and the nitride film 35 are eliminated.

In the embodiment of the present invention, the drift region 33 is formed before the field oxide film 36 is formed. The drift region 33 may be formed by controlling an energy and a dose after the field oxide film 36 is formed.

Figure 2E:
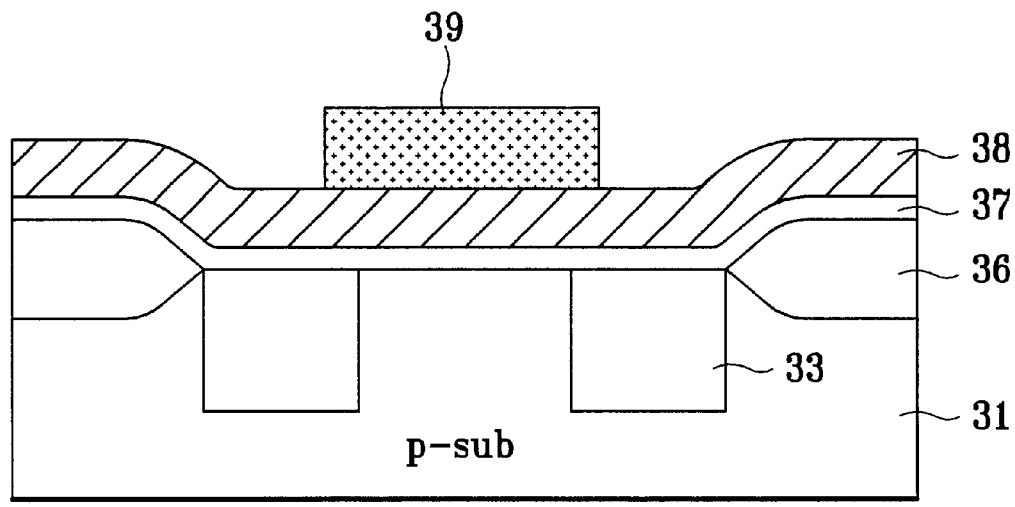

As shown in FIG. 2e, a gate oxide film 37 is formed on an entire fifth surface of the semiconductor substrate 31 and a polysilicon layer 38 is formed on the gate oxide film 37. A second photoresist 39 is doped on the polysilicon layer 38. The second photoresist 39 is then patterned by exposing and developing processes to define a gate region.

Figure 2F:
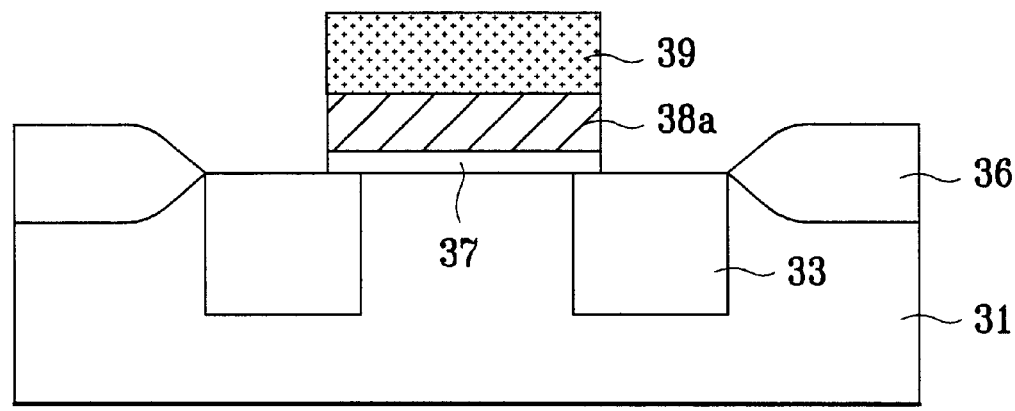

As shown in FIG. 2f, the polysilicon layer 38 and the gate oxide film 37 are selectively eliminated using the patterned second photoresist 39 as a mask, so that a gate electrode 38a is formed.

Figure 2G:
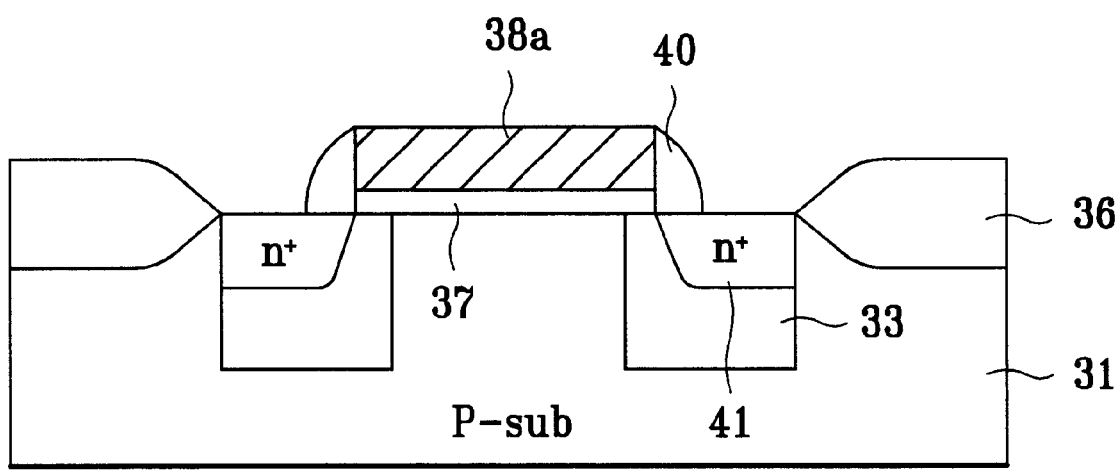

As shown in FIG. 2g, an insulating film is formed on an entire sixth surface of the semiconductor substrate 31 including the gate electrode 38a. A sidewalls 40 is formed at both sides of the gate electrode 38a by etching back process.

N-type high-concentration impurity ions for source/drain are implanted into an entire seventh surface of the semiconductor substrate 31. A source/drain diffusion region 41 connected to a lightly doped drain region 40 is formed in the seventh surface of the semiconductor substrate 31 at both sides of the gate electrode 38a.

The source/drain diffusion region 41 may be formed in non-self alignment, i.e., offset type using a separate mask (not shown) to increase the breakdown voltage of the high voltage transistor.

Accordingly, in the present invention, a deep junction is formed by implanting an ion source having an energy and a dose of the related art and implanting a high energy ion of the same conductive type with that of the related art, when forming the drift region 33 to prevent lines of an electrical field from concentrating.

Figure 3A:
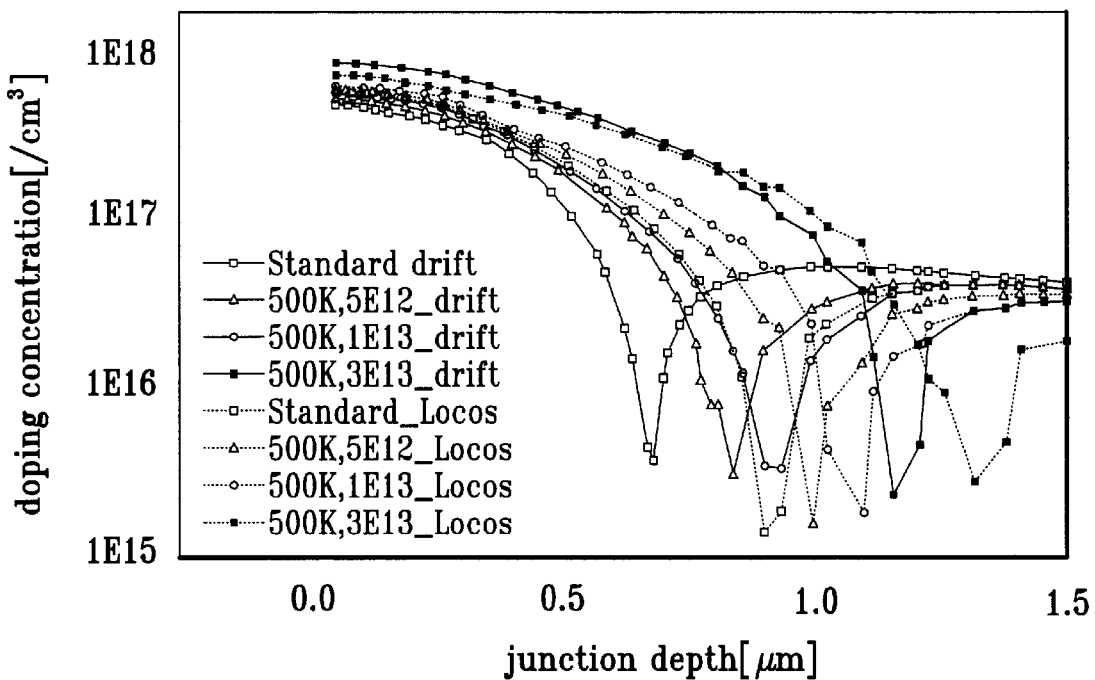
FIG. 3a is a graph of simulation results of a profile showing doping concentration and junction depth when an ion implantation energy is 500 keV but a dose is varied.
Figure 3B:
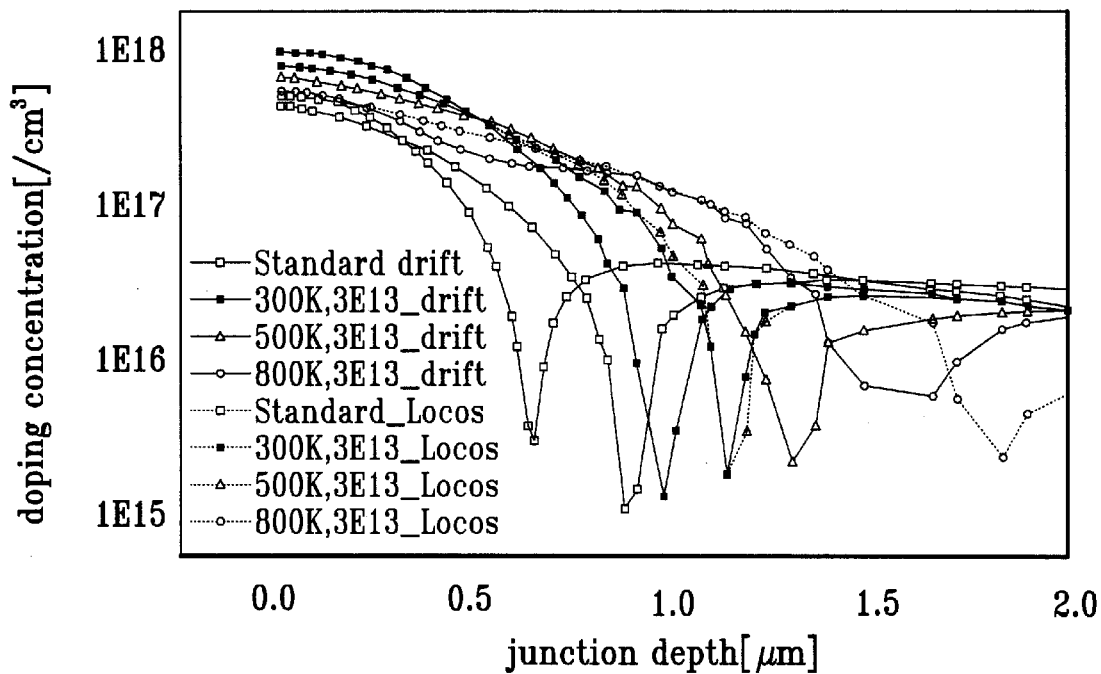
FIG. 3b is a graph of simulation results of a profile showing doping concentration and junction depth when a dose is fixed at 3E13 but an ion implantation energy is varied.

Meanwhile, FIGS. 3a and 3b show simulations of profile of the drift region and the field oxide film.

As shown in FIGS. 3a and 3b, the junction depth may be increased while the original profile is maintained, so that the junction depth is increased and a depletion width is uniform depending on an increase of an energy.

The ion energy and the dose should finely be controlled to form the drift region having the above simulation. Therefore, the breakdown voltage is increased about 5V compared with that an ion is not applied on a partial condition as a simulation result of the high voltage transistor. Since the drift region is deeply formed to increase the breakdown voltage using the same heat diffusion process with that of the related art, the drift region having the same depth by the relatively low heat diffusion process is formed and the same breakdown voltage can be obtained.

Since the drift region having the same depth may be obtained by the heat diffusion process of relatively low temperature than that of the related art heat diffusion process, the process may easily be varied, thereby improving packing density advantages.

As has been explained above, a method for fabricating a high voltage transistor according to the present invention has the following advantages. It is not necessary to perform an additional heat diffusion process to form a deep drift region. Accordingly, lateral diffusion of the dopant is prevented from being generated, so that a margin of a short channel effect is improved, thereby reducing design rule and obtaining packing density. The heat diffusion process may additionally be performed to form the drift region deeper than the related art drift region, thereby increasing the junction breakdown voltage. Since the heat diffusion process may not be performed, the process may easily be changed with relatively low thermal budget.

It will be apparent to those skilled in the art that various modifications and variations can be made in the method for fabricating the high voltage transistor according to the present invention without departing from the spirit or scope of the invention. Thus, it is intended that the present invention covers the modifications and variations of the invention provided they come within the scope of the appended claims and their equivalents.

What is claimed is:

1. A method for fabricating a high voltage transistor comprising the steps of:

forming a plurality of drift regions on a semiconductor substrate of a first conductive type;

implanting drift ions of a second conductive type into surfaces of the drift regions of the semiconductor substrate at a first depth;

implanting drift ions of the second conductive type into the surfaces of the drift regions of the semiconductor substrate at a second depth, the second depth being deeper than the first depth;

implanting first conductive channel stop ions into the semiconductor substrate, thereby forming a space between the semiconductor substrate and the drift regions;

forming a device isolation film on a surface of the semiconductor substrate into which the channel stop ions are implanted;

forming a gate electrode by inserting a gate insulating film on the semiconductor substrate between the drift regions; and forming a source/drain impurity diffusion region of a second conductive type in the surface of the semiconductor substrate at both sides of the gate electrode.

2. The method for fabricating a high voltage transistor according to claim 1, further comprising the step of performing a heat diffusion process after the step of implanting the drift ions of the second conductive type.

3. The method for fabricating a high voltage transistor according to claim 2, wherein the heat diffusion process is performed at 900° C. to 1100° C.

4. The method for fabricating a high voltage transistor according to claim 1, wherein the first depth is 0.01 $\mu$m to 0.2 $\mu$m.

5. The method for fabricating a high voltage transistor according to claim 1, wherein the second depth is 0.5 $\mu$m to 1.51 $\mu$m.

6. The method for fabricating a high voltage transistor according to claim 1, wherein the channel stop ions are implanted at intervals from the drift regions.

7. The method for fabricating a high voltage transistor according to claim 6, wherein the intervals are 0.5 $\mu$m to 2.0 $\mu$m from the drift regions.

8. The method for fabricating a high voltage transistor according to claim 1, wherein the source/drain impurity diffusion region is formed using a mask.

9. The method for fabricating a high voltage transistor according to claim 1, wherein the first conductive type is a p-type, and the second conductive type is an n-type.

10. The method for fabricating a high voltage transistor according to claim 1, wherein the first and second depths are formed by fixing a dose and varying an ion implantation energy.

11. The method for fabricating a high voltage transistor according to claim 10, wherein the dose is 3E13.

12. The method for fabricating a high voltage transistor according to claim 1, wherein the first and second depths are formed by fixing an ion implantation energy and varying a dose.

13. The method for fabricating a high voltage transistor according to claim 12, wherein the ion implantation energy is 500 keV.

14. The method for fabricating a high voltage transistor according to claim 1, further comprising the step of forming the drift regions after forming the device isolation film.

15. The method for fabricating a high voltage transistor according to claim 1, further comprising the step of forming sidewall spacers at both sides of the gate electrode.

* * * * *